US009836844B2

(12) United States Patent
Miyazaki et al.

(10) Patent No.: US 9,836,844 B2
(45) Date of Patent: Dec. 5, 2017

(54) COATING APPARATUS AND COATING METHOD

(71) Applicant: Tokyo Electron Limited, Tokyo (JP)

(72) Inventors: Kazuhito Miyazaki, Kumamoto (JP); Akira Kakino, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 354 days.

(21) Appl. No.: 14/663,814

(22) Filed: Mar. 20, 2015

(65) Prior Publication Data

US 2015/0281654 A1 Oct. 1, 2015

(30) Foreign Application Priority Data

Mar. 26, 2014 (JP) .................... 2014-064321

(51) Int. Cl.
| | |
|---|---|
| G01B 11/16 | (2006.01) |
| G06T 7/00 | (2017.01) |
| G01B 11/06 | (2006.01) |
| G05B 19/402 | (2006.01) |
| G06T 7/73 | (2017.01) |

(52) U.S. Cl.
CPC ........ *G06T 7/0024* (2013.01); *G01B 11/0616* (2013.01); *G05B 19/402* (2013.01); *G06T 7/73* (2017.01); *G05B 2219/37572* (2013.01); *G05B 2219/45013* (2013.01); *G06T 2207/30164* (2013.01)

(58) Field of Classification Search
None
See application file for complete search history.

(56) References Cited

U.S. PATENT DOCUMENTS

| | | | | |
|---|---|---|---|---|
| 2008/0198247 | A1* | 8/2008 | Yonaha | H04N 5/232 348/254 |
| 2012/0014084 | A1* | 1/2012 | Motomura | B23K 3/0638 361/807 |
| 2012/0319326 | A1* | 12/2012 | Shiraishi | B82Y 10/00 264/293 |

(Continued)

FOREIGN PATENT DOCUMENTS

| | | |
|---|---|---|
| JP | 2001-297966 A | 10/2001 |
| JP | 2004-186283 A | 7/2004 |

(Continued)

*Primary Examiner* — Eileen Adams
(74) *Attorney, Agent, or Firm* — Abelman, Frayne & Schwab

(57) ABSTRACT

Disclosed is a coating apparatus. A first imaging unit captures an image of the substrate disposed on the stage. A second imaging unit captures an image of the substrate disposed on the stage with a narrower viewing angle and higher resolution than the first imaging unit. The control unit performs a pre-alignment processing of capturing an image of a circular pre-alignment mark formed on the substrate using the first imaging unit and performing positioning of the substrate by controlling the moving mechanism and the rotating mechanism based on the captured image and, after the pre-alignment processing, performs a fine-alignment processing of capturing an image of a circular fine-alignment mark formed on the substrate using the second imaging unit and performing positioning of the substrate by controlling the moving mechanism and the rotating mechanism based on the captured image.

11 Claims, 7 Drawing Sheets

(56) References Cited

U.S. PATENT DOCUMENTS

2013/0135458 A1* 5/2013 Taniguchi ............ B41F 33/0081
348/95

FOREIGN PATENT DOCUMENTS

| | | |
|---|---|---|
| JP | 2004-281983 A | 10/2004 |
| JP | 2007-301428 A | 11/2007 |
| JP | 2010-176138 A | 8/2010 |
| JP | 2012-093118 A | 5/2012 |

* cited by examiner

COATING APPARATUS AND COATING METHOD

CROSS-REFERENCE TO RELATED APPLICATIONS

This application is based on and claims priority from Japanese Patent Application No. 2014-064321, filed on Mar. 26, 2014, with the Japan Patent Office, the disclosure of which is incorporated herein in its entirety by reference.

TECHNICAL FIELD

Exemplary embodiments disclosed herein relate to a coating apparatus and a coating method.

BACKGROUND

Recently, in manufacturing processes of, for example, organic electro luminescent (EL) display devices or color filters, an inkjet method has been considered as a technology to coat each of red (R), green (G), and blue (B) coating materials on a substrate. The inkjet method coats a required amount of a coating material on a required location using the principle of an inkjet printer that is widely used for color printing.

In a case where the inkjet method is used to coat multiple kinds of coating materials, a bank is formed on a substrate and coating a coating material on a region surrounded by the bank in order to prevent a coating material coated on any region from flowing out to an adjacent region (see, e.g., Japanese Patent Laid-Open Publication No. 2010-176138).

SUMMARY

A coating apparatus of the present disclosure includes a stage, a moving mechanism, a rotating mechanism, a plurality of nozzles, a first imaging unit, a second imaging unit, and a control unit. The stage is configured to dispose a substrate thereon. The moving mechanism is configured to move the stage in a horizontal direction. The rotating mechanism is configured to rotate the stage around a vertical axis. The plurality of nozzles are arranged side by side in a horizontal direction above the stage so as to coat a coating material on the substrate disposed on the stage. The first imaging unit is configured to capture an image of the substrate disposed on the stage. The second imaging unit configured to capture an image of the substrate disposed on the stage with a narrower viewing angle and higher resolution than the first imaging unit. The control unit is configured to control the moving mechanism, the rotating mechanism, the first imaging unit, and the second imaging unit. The control unit performs a pre-alignment processing of capturing an image of a circular pre-alignment mark formed on the substrate using the first imaging unit and performing positioning of the substrate by controlling the moving mechanism and the rotating mechanism based on the captured image and, after the pre-alignment processing, performs a fine-alignment processing of capturing an image of a circular fine-alignment mark formed on the substrate using the second imaging unit and performing positioning of the substrate by controlling the moving mechanism and the rotating mechanism based on the captured image.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
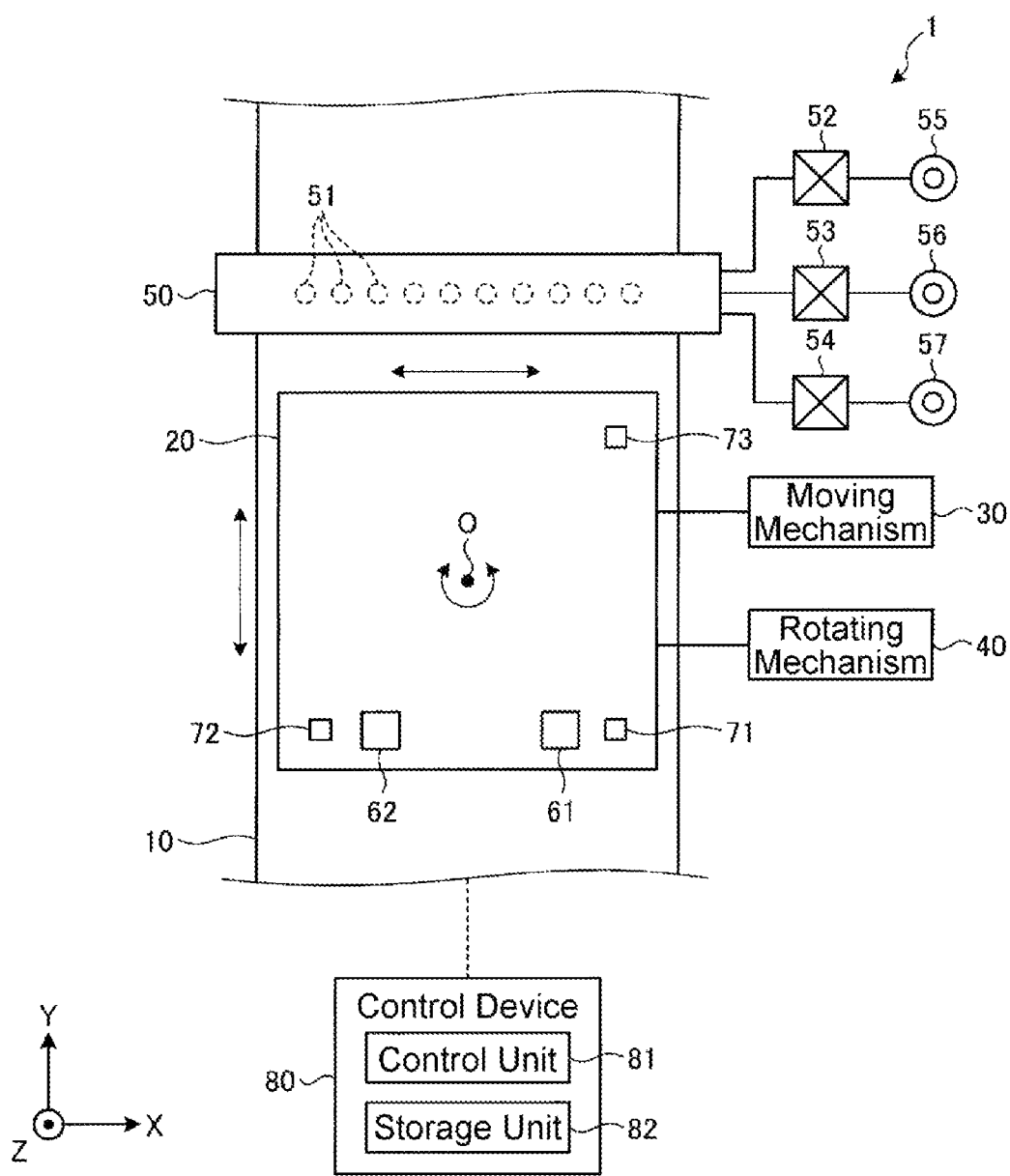
FIG. 1 is a schematic plan view illustrating a configuration of a coating apparatus according to an exemplary embodiment.

In the following detailed description, reference is made to the accompanying drawings, which form a part hereof. The illustrative embodiments described in the detailed description, drawing, and claims are not meant to be limiting. Other exemplary embodiments may be utilized, and other changes may be made without departing from the spirit or scope of the subject matter presented here.

The related art as described above has room for improvement in coating the coating material inside the bank with high precision.

One aspect of the present disclosure is to provide a coating apparatus and a coating method capable of coating a coating material inside a bank formed on a substrate with high precision.

A coating apparatus of the present disclosure includes a stage, a moving mechanism, a rotating mechanism, a plurality of nozzles, a first imaging unit, a second imaging unit, and a control unit. The stage is configured to dispose a substrate thereon. The moving mechanism is configured to move the stage in a horizontal direction. The rotating mechanism is configured to rotate the stage around a vertical axis. The plurality of nozzles are arranged side by side in a horizontal direction above the stage so as to coat a coating material on the substrate disposed on the stage. The first imaging unit is configured to capture an image of the substrate disposed on the stage. The second imaging unit configured to capture an image of the substrate disposed on the stage with a narrower viewing angle and higher resolution than the first imaging unit. The control unit is configured to control the moving mechanism, the rotating mechanism, the first imaging unit, and the second imaging unit. The control unit performs a pre-alignment processing of capturing an image of a circular pre-alignment mark formed on the substrate using the first imaging unit and performing positioning of the substrate by controlling the moving mechanism and the rotating mechanism based on the captured image and, after the pre-alignment processing, performs a fine-alignment processing of capturing an image of a circular fine-alignment mark formed on the substrate using the second imaging unit and performing positioning of the substrate by controlling the moving mechanism and the rotating mechanism based on the captured image.

In the coating apparatus, the control unit captures the image of the pre-alignment mark, having a greater diameter than a diameter of the fine-alignment mark, using the first imaging unit.

The coating apparatus includes two first imaging units configured to capture images of two pre-alignment marks formed on the substrate, respectively, and three second imaging units configured to capture images of three fine-alignment marks formed on the substrate, respectively.

The fine-alignment marks include: a first mark formed in a vicinity of one corner portion among corner portions of the substrate having a rectangular shape; a second mark formed near another corner portion adjacent to the one corner portion among the corner portions of the substrate; and a third mark formed at a location other than a location on a line passing the first mark and the second mark, and in the fine-alignment processing. The control unit estimates a center position of a bank forming region on the substrate based on positions of the first mark, the second mark, and the third mark, of which the images are captured by the three second imaging units, respectively, and matches the estimated center position with a preset reference position.

In the coating apparatus, the control unit calculates each of a center of gravity of the pre-alignment marks, of which the images are captured by the first imaging units, and a center of gravity of the fine-alignment marks, of which the images are captured by the second imaging units, and detects the calculated centers of gravity as positions of the pre-alignment marks and the fine-alignment marks.

In the coating apparatus, the control unit approximates the pre-alignment marks, of which the images are captured by the first imaging units, and the fine-alignment marks, of which the images are captured by the second imaging units, to a true circle, and then, calculates the centers of gravity of the pre-alignment marks and the fine-alignment marks.

According to another aspect of the present disclosure, a coating method includes: a disposition process of horizontally disposing a substrate on a stage configured to be movable in a horizontal direction by a moving mechanism and rotatable around a vertical axis by a rotating mechanism; a pre-alignment process of capturing an image of a circular pre-alignment mark formed on the substrate using a first imaging unit and performing positioning of the substrate by controlling the moving mechanism and the rotating mechanism based on the captured image; after the pre-alignment process, a fine-alignment process of capturing an image of a circular fine-alignment mark, having a smaller diameter than the pre-alignment mark and formed on the substrate, using a second imaging unit with a narrower viewing angle and higher resolution than the first imaging unit, and performing positioning of the substrate by controlling the moving mechanism and the rotating mechanism based on the captured image; and after the fine-alignment process, a coating process of coating a coating material on the substrate using a plurality of nozzles, located above the stage and arranged side by side in the horizontal direction, while moving the substrate using the moving mechanism.

According to one aspect of the present disclosure, a coating material is capable of being coated within a bank formed on a substrate with high precision.

Hereinafter, exemplary embodiments of a coating apparatus and a coating method disclosed herein will be described in detail with reference to the accompanying drawings. The present disclosure is not limited by the exemplary embodiments described below.

FIG. 1 is a schematic plan view illustrating a configuration of a coating apparatus according to an exemplary embodiment. In the following description, for clarity of positional relationships, the X-axis direction, the Y-axis direction, and the Z-axis direction perpendicular to one another are defined and the positive Z-axis direction is referred to as a vertical upward direction.

As illustrated in FIG. 1, a coating apparatus 1 according to the present exemplary embodiment includes a conveyance path 10, a stage 20, a shift mechanism 30, a rotating mechanism 40, and a carriage 50. In addition, the coating apparatus 1 includes first imaging units 61 and 62, second imaging units 71 to 73, and a control device 80. For example, the coating apparatus 1 coats each of red (R), green (G), and blue (B) coating materials (organic materials) on a substrate such as, for example, a glass substrate used for an organic EL panel, in an inkjet manner.

The conveyance path 10 extends in the Y-axis direction and the stage 20 is disposed on the conveyance path 10. The stage 20 is a rectangular pedestal formed of, for example, a stone surface plate and a substrate is disposed on the stage 20. In addition, the stage 20 continuously attracts the substrate by a suction device (not illustrated).

The moving mechanism 30 moves the stage 20 in the horizontal direction, more particularly, in the Y-axis direction and the X-axis direction. The rotating mechanism 40 rotates the stage 20 around the vertical axis passing the center point O of the stage 20.

The carriage 50 is disposed above the stage 20. The carriage 50 includes a plurality of coating nozzles 51 arranged side by side along the X-axis direction. The coating nozzles 51 are connected to any one of an R coating material supply source 55, a G coating material supply source 56, and a B coating material supply source 57 through any one of supply device groups 52 to 54 each including, for example, a valve or a flow rate control unit.

The first imaging units 61 and 62 and the second imaging units 71 to 73 are disposed above the stage 20 so as to image the substrate disposed on the stage 20. The second imaging units 71 to 73 image the substrate with a narrower viewing angle and higher resolution than the first imaging units 61 and 62.

The first imaging units 61 and 62 are located at positions corresponding to pre-alignment marks formed on the substrate, and the second imaging units 71 to 73 are located at positions corresponding to fine-alignment marks formed on the substrate. This will be described later.

The control device 80 controls an operation of the coating apparatus 1. The control device 80 is, for example, a computer and includes a control unit 81 and a memory 82. The memory 82 stores a program to control various processings such as, for example, a coating processing. The control unit 81 is, for example, a central processing unit (CPU) and controls an operation of the coating apparatus 1 by reading and executing the program stored in the memory 82.

In addition, the program may be a program originally recorded in a computer-readable recording medium and installed in the memory 82 of the control device 80 from the recording medium. The computer readable recording medium may be a hard disk (HD), a floppy disk (FD), a compact disc (CD), a magneto-optical disc (MO), or a memory card, for example. In addition, the control unit 81 may be configured only with hardware without using any program.

Figure 2:
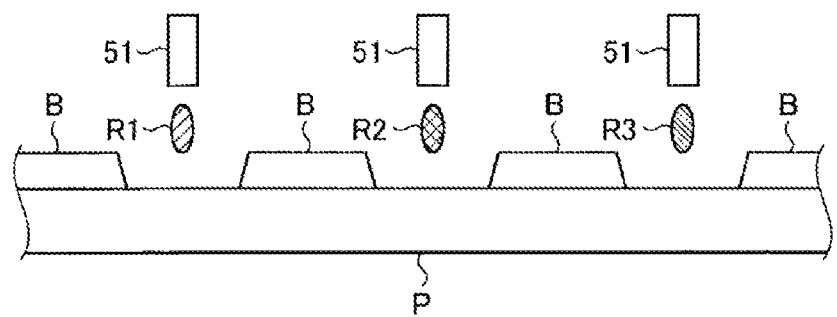
FIG. 2 is an explanatory view illustrating a coating method according to the present exemplary embodiment.

The coating apparatus 1 described above coats each of red (R), green (G), and blue (B) coating materials on the substrate on the stage 20 from the coating nozzles 51 of the carriage 50 while moving the stage 20 in the positive Y-axis direction using the moving mechanism 30. Here, contents of a coating method according to the present exemplary embodiment will be described with reference to FIG. 2. FIG. 2 is an explanatory view illustrating a coating method according to the present exemplary embodiment.

As illustrated in FIG. 2, a partition called a bank B is formed on a substrate P, and a red (R) coating material R1, a green (G) coating material R2, and a blue (B) coating material R3 are respectively coated in dot regions partitioned by the bank B.

Figure 3:
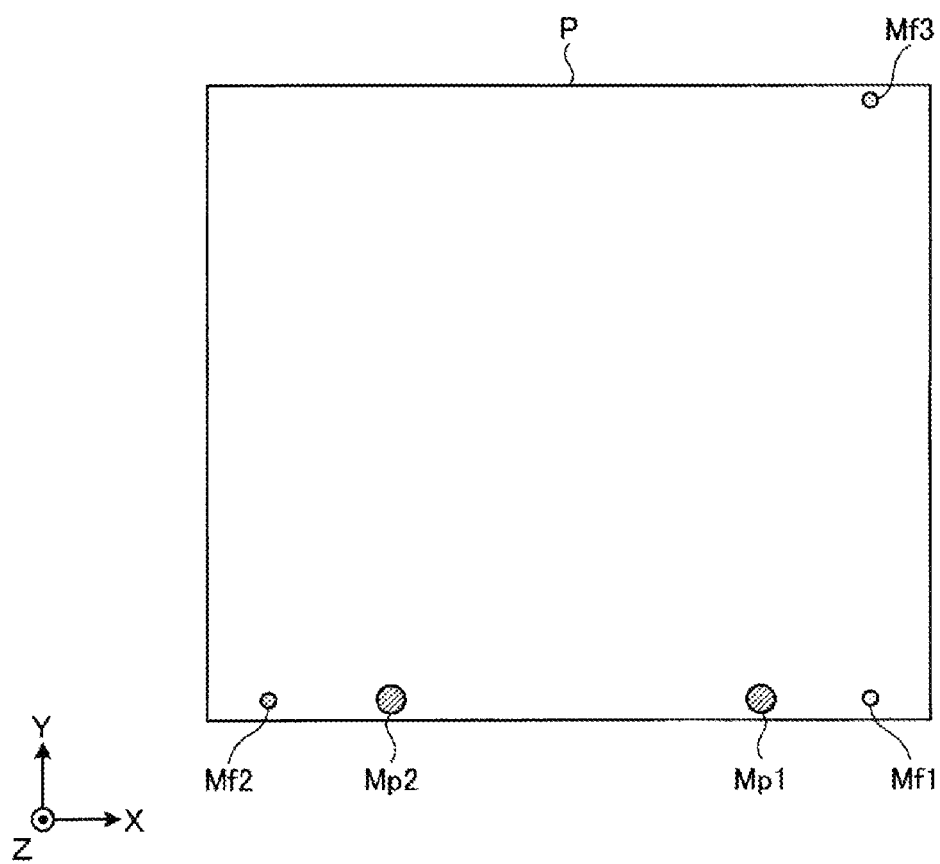
FIG. 3 is a schematic plan view illustrating a substrate.

The coating apparatus 1 according to the present exemplary embodiment performs an alignment processing of the substrate P disposed on the stage 20 before the above-described coating processing. Here, alignment marks formed on the substrate P will be described with reference to FIG. 3. FIG. 3 is a schematic plan view illustrating the substrate P.

As illustrated in FIG. 3, the substrate P is formed with two kinds of alignment marks including pre-alignment marks Mp1 and Mp2 and fine-alignment marks Mf1 to Mf3.

A fine-alignment mark Mf1 (corresponding to one exemplary "first mark") is formed near, for example, a corner portion of the substrate P in the negative Y-axis direction and the positive X-axis direction, and a fine-alignment mark Mf2 (corresponding to one exemplary "second mark") is formed near, for example, a corner portion of the substrate P in the negative Y-axis direction and the negative X-axis direction. In addition, a fine-alignment mark Mf3 (corresponding to one exemplary "third mark") is formed near, for example, a corner portion of the substrate P in the positive Y-axis direction and the positive X-axis direction.

In addition, the pre-alignment marks Mp1 and Mp2 are formed in parallel with the fine-alignment marks Mf1 and Mf2 between the fine-alignment marks Mf1 and Mf2. These pre-alignment marks Mp1 and Mp2 and fine-alignment marks Mf1 to Mf3 are formed using an exposure device in conjunction with the above-described bank B.

In addition, the fine-alignment mark Mf3 does not need to be formed near the corner portion. For example, in a case where there is no space for arrangement of the second imaging unit 73 near the corner portion of the substrate P in the positive Y-axis direction and the positive X-axis direction, the fine-alignment mark Mf3 may be formed in the negative Y-axis direction other than the corner portion of the substrate P in the positive Y-axis direction and the positive X-axis direction. At least, the fine-alignment mark Mf3 may be formed at a location except for on a line passing the fine-alignment mark Mf1 and the fine-alignment mark Mf2.

Figure 4:
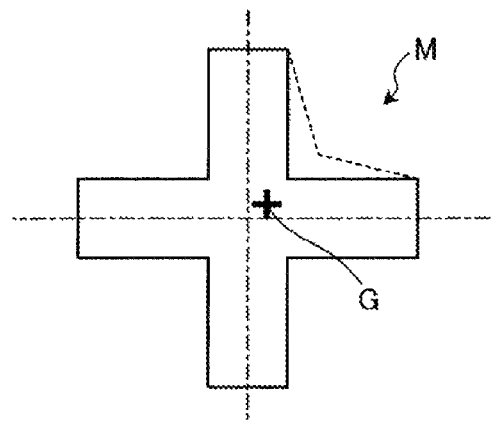
FIG. 4 is a schematic plan view illustrating a conventional alignment mark.
Figure 5:
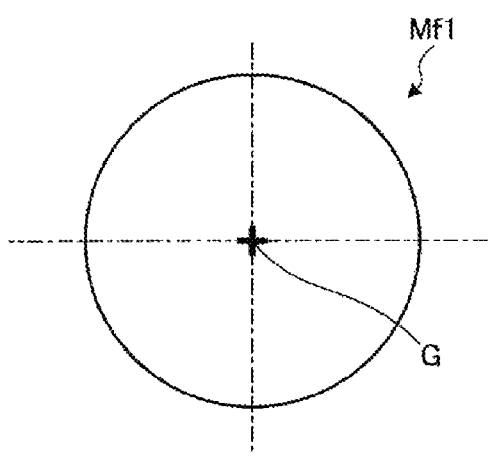
FIG. 5 is a schematic plan view illustrating an alignment mark according to the present exemplary embodiment.

In the present exemplary embodiment, the pre-alignment marks Mp1 and Mp2 and the fine-alignment marks Mf1 to Mf3 have a circular shape. This will be described below with reference to FIGS. 4 and 5. FIG. 4 is a schematic plan view illustrating a conventional alignment mark and FIG. 5 is a schematic plan view illustrating an alignment mark according to the present exemplary embodiment. In addition, FIG. 5 illustrates a schematic plan view of the fine-alignment mark Mf1 by way of an example.

As illustrated in FIG. 4, for example, in an exposure device, a substrate alignment processing has been performed by detecting a center of gravity G of a cross-shaped alignment mark M. However, the center of gravity G of the cross-shaped alignment mark M is easily dislocated since the cross-shaped alignment mark M is difficult to mold and is easily deformed. In particular, an exposure device for forming a bank or an alignment mark on a substrate used for an organic EL panel is occasionally less precise than an exposure device for forming a fine wiring pattern, and deformation of the alignment mark M is easily caused.

For this reason, the present embodiment uses a circular alignment mark as illustrated in FIG. 5. Since the circular alignment mark is easy to mold and is not easily deformed as compared to the cross-shaped alignment mark, the center of gravity G of the circular alignment mark is not easily dislocated even if a less precise exposure device was used. Accordingly, with the coating apparatus 1 according to the present exemplary embodiment, the positions of the pre-alignment marks Mp1 and Mp2 and the fine-alignment marks Mf1 to Mf3 may be detected correctly so that the alignment of the substrate P may be performed with high precision.

Here, a method for detecting the positions of the pre-alignment marks Mp1 and Mp2 and the fine-alignment marks Mf1 to Mf3 will be described.

In the coating apparatus 1 according to the present exemplary embodiment, first, the control unit 81 approximates shapes of the pre-alignment marks Mp1 and Mp2, of which the images are captured by the first imaging units 61 and 62, and shapes of the fine-alignment marks Mf1 to Mf3, of which the images are captured by the second imaging units 71 to 73, to a true circle using a least-square method. Then, the control unit 81 calculates the centers of gravity G of the pre-alignment marks Mp1 and Mp2 and the fine-alignment marks Mf1 to Mf3 which have shapes approximated to a true circle and detects the calculated centers of gravity G as the positions of the pre-alignment Mp1 and Mp2 and the fine-alignment marks Mf1 to Mf3.

As described above, the control unit 81 calculates the centers of gravity of the pre-alignment marks Mp1 and Mp2 and the fine-alignment marks Mf1 to Mf3 after approximating the shapes of the alignment marks to a true circle. Therefore, even if the shapes of the pre-alignment marks Mp1 and Mp2 and the fine-alignment marks Mf1 to Mf3 were deformed, the deformation is corrected and, therefore, the centers of gravity of these alignment marks are not easily dislocated. Accordingly, the positions of the pre-alignment marks Mp1 and Mp2 and the fine-alignment marks Mf1 to Mf3 may be precisely detected.

In addition, descriptions have been made on the case where the least-square method is used as a method for approximating the pre-alignment marks Mp1 and Mp2 and the fine-alignment marks Mf1 to Mf3 to a true circle by way of an example. Without being limited to the least-square method, however, the control unit 81 may approximate the pre-alignment marks Mp1 and Mp2 and the fine-alignment marks Mf1 to Mf3 to a true circle using other methods such as, for example, a maximum likelihood estimation method.

Figure 6:
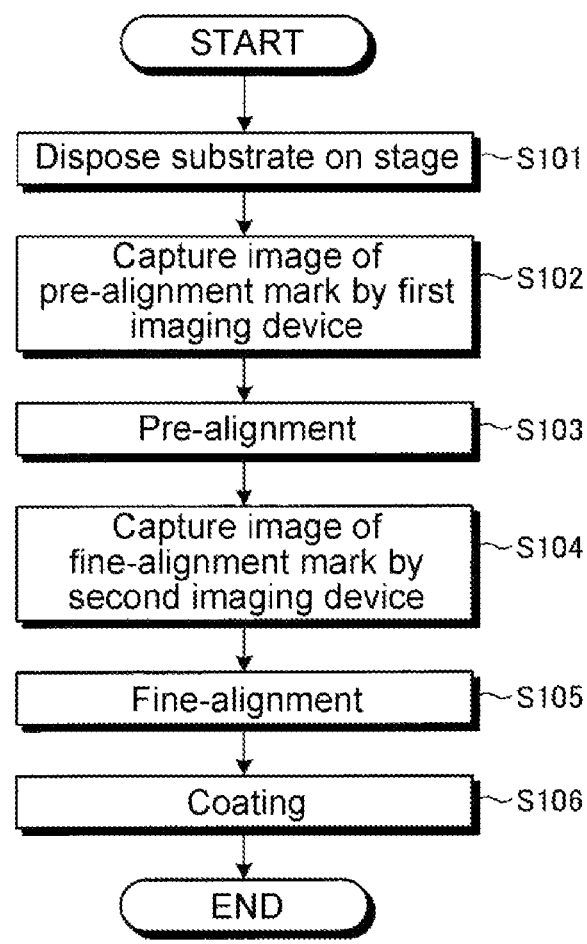
FIG. 6 is a flowchart illustrating processing procedures of a process performed by the coating apparatus.
Figure 7:
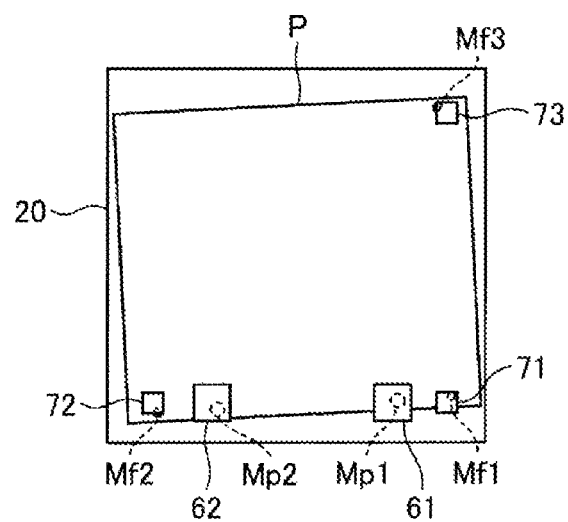
FIG. 7 is a view illustrating an exemplary substrate before pre-alignment.
Figure 8:
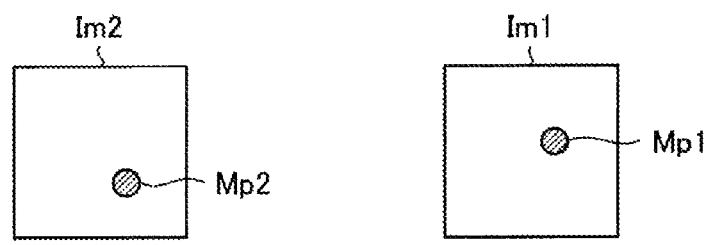
FIG. 8 is a view illustrating exemplary images captured by first imaging units.
Figure 9:
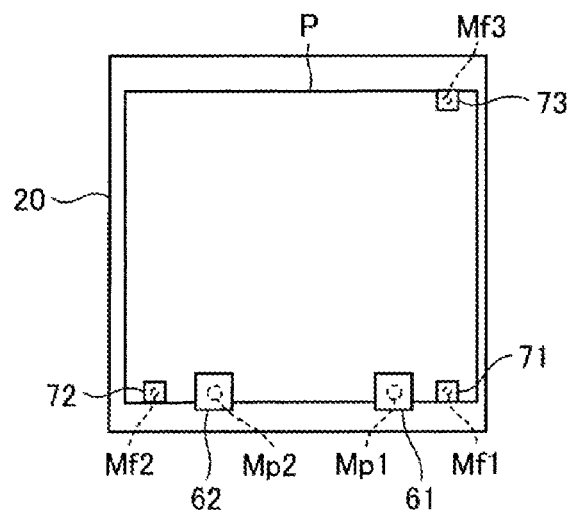
FIG. 9 is a view illustrating an exemplary pre-alignment operation.
Figure 10:
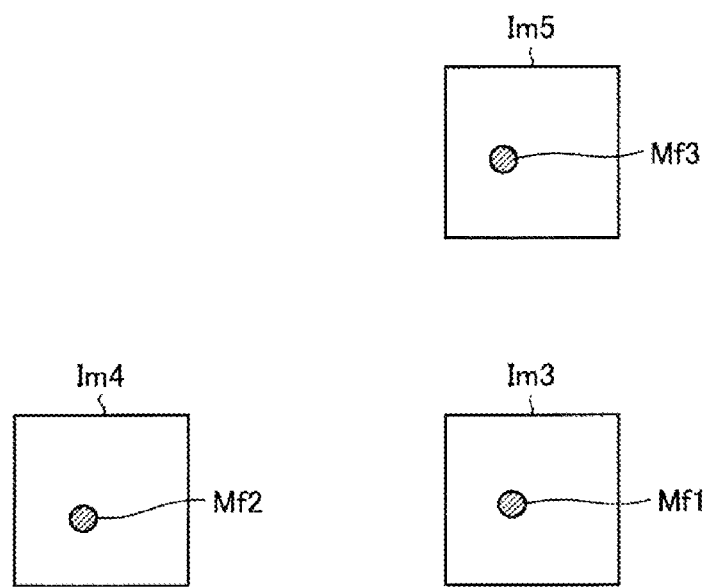
FIG. 10 is a view illustrating exemplary images captured by second imaging units.
Figure 11:
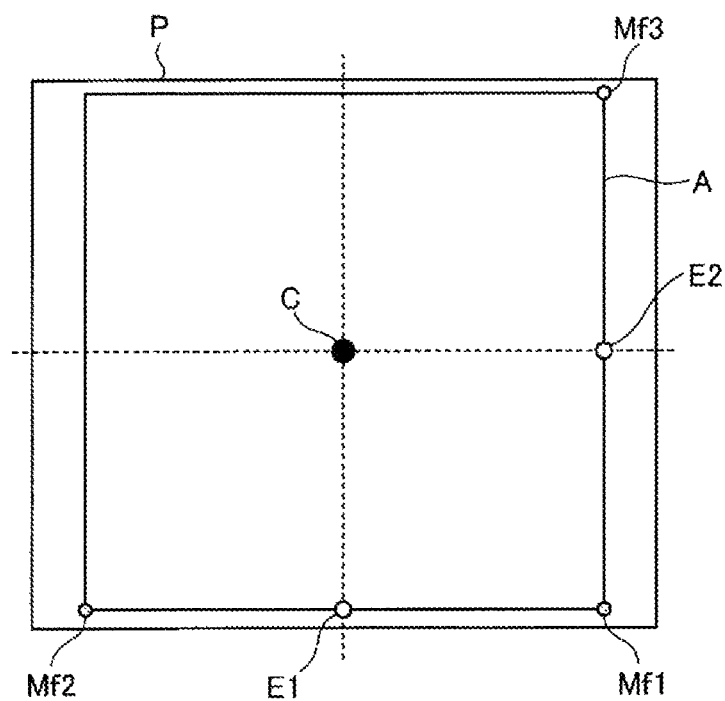
FIG. 11 is a view illustrating an exemplary fine-alignment operation.

Subsequently, processing procedures of a process performed by the coating apparatus 1 according to the present exemplary embodiment will be described with reference to FIGS. 6 to 11. FIG. 6 is a flowchart illustrating processing procedures of a process performed by the coating apparatus 1. In addition, FIG. 7 is a view illustrating an exemplary substrate P before pre-alignment, FIG. 8 is a view illustrating exemplary images captured by the first imaging units 61 and 62, and FIG. 9 is a view illustrating an exemplary pre-alignment operation. In addition, FIG. 10 is a view illustrating exemplary images captured by the second imaging units 71 to 73, and FIG. 11 is a view illustrating an exemplary fine-alignment operation. In addition, the coating apparatus 1 performs each processing procedure illustrated in FIG. 6 according to a control of the control device 80.

As illustrated in FIG. 6, in the coating apparatus 1, first, the substrate P is conveyed by a conveyance robot (not illustrated) and disposed on the stage 20 (step S101). The substrate P disposed on the stage 20 is attracted to and held on the stage 20 by a suction device (not illustrated).

The conveyance robot is controlled to locate the substrate P at a predetermined position where each of the pre-alignment marks Mp1 and Mp2 and the fine-alignment marks Mf1 to Mf3 enters viewing angles of the first imaging units 61 and 62 and the second imaging units 71 to 73. However, as illustrated in FIG. 7, for example, the substrate P may be located at a position deviated from the predetermined position on the stage 20.

Subsequently, the coating apparatus 1 captures images of the pre-alignment marks Mp1 and Mp2 using the first imaging units 61 and 62 (step S102).

As illustrated in FIG. 8, the pre-alignment marks Mp1 and Mp2 are included respectively in imaging regions Im1 and Im2 of the first imaging units 61 and 62.

Here, the second imaging units 71 to 73 configured to capture images of the fine-alignment marks Mf1 to Mf3 capture the images of the fine-alignment marks Mf1 to Mf3 at a higher resolution than the first imaging units 61 and 62, for the sake of precise positioning of the substrate P. Meanwhile, since it is necessary to provide a space for allowing the conveyance robot to access the stage 20 above the stage 20 and is inevitable to arrange the second imaging units 71 to 73 to be somewhat spaced apart from the stage 20, an available length of a lens is limited. For this reason, it is difficult to expand the viewing angles of the second imaging units 71 to 77 and, in a case where the substrate P deviates from a predetermined position as described above, it may be impossible to perform alignment using the fine-alignment marks Mf1 to Mf3 since the fine-alignment marks Mf1 to Mf3 are apt to protrude from the imaging regions of the second imaging units 71 to 73.

Whereas, the coating apparatus 1 according to the present exemplary embodiment captures the images of the pre-alignment marks Mp1 and Mp2 using the first imaging units 61 and 62. The first imaging units 61 and 62 may have a wider viewing angle than the second imaging units 71 to 73 since the first imaging units 61 and 62 capture the images of the pre-alignment marks Mp1 and Mp2 at a lower resolution than the second imaging units 71 to 73. Accordingly, even if the substrate P is disposed to deviate from a predetermined position, the pre-alignment marks Mp1 and Mp2 are not apt to protrude from the imaging regions Im1 and Im2 of the first imaging units 61 and 62.

In addition, the first imaging units 61 and 62 have a lower resolution than the second imaging units 71 to 73 and, therefore, the pre-alignment marks Mp1 and Mp2 are formed to have a greater diameter than the fine-alignment marks Mf1 to Mf3. Specifically, the pre-alignment marks Mp1 and Mp2 have a diameter of several millimeters, while the diameter of the fine-alignment marks Mf1 to Mf3 is about one half of the diameter of the pre-alignment marks Mp1 and Mp2.

Subsequently, the coating apparatus 1 performs pre-alignment of the substrate P based on the images captured by the first imaging units 61 and 62 (step S103). For example, the coating apparatus 1 rotates the stage 20 using the rotating mechanism 40 such that the pre-alignment mark Mp1 and the pre-alignment mark Mp2 form a line along the X-axis direction. In addition, the coating apparatus 1 moves the stage 20 using the moving mechanism 30 such that the pre-alignment mark Mp1 is located at a predetermined position in the imaging region Im1 (for example, at the center of the imaging region Im1). As a result, as illustrated in FIG. 9, the substrate P is roughly positioned. In addition, the rotation of the stage 20 by the rotating mechanism 40 and the movement of the stage 20 by the moving mechanism 30 are simultaneously performed.

Subsequently, the coating apparatus 1 captures again the images of the pre-alignment marks Mp1 and Mp2 using the first imaging units 61 and 62 and, after confirming that the pre-alignment marks Mp1 and Mp2 are located at predetermined positions, captures the images of the fine-alignment marks Mf1 to Mf3 using the second imaging units 71 to 73 (step S104).

As described above, the coating apparatus 1 according to the present exemplary embodiment performs pre-alignment in advance so that the substrate P is roughly positioned. Therefore, as illustrated in FIG. 10, the fine-alignment marks Mf1 to Mf3 may be accommodated with high precision in the imaging regions Im3 to Im5 of the second imaging units 71 to 73, respectively.

Subsequently, the coating apparatus 1 performs fine-alignment of the substrate P based on the images captured by the second imaging units 71 to 73 (step S105).

Specifically, the coating apparatus 1 estimates the center position of a region forming the bank B on the substrate P based on the positions of the fine-alignment marks Mf1 to Mf3, of which the images are captured by the second imaging units 71 to 73, and moves and rotates the substrate P using the moving mechanism 30 and the rotating mechanism 40 such that the estimated position coincides with a preset reference position.

For example, as illustrated in FIG. 11, it is assumed that the fine-alignment marks Mf1 to Mf3 are located respectively at the corner portions of a bank forming region A. Information related to a positional relationship between the fine-alignment marks Mf1 to Mf3 and the bank forming region A is pre-stored in the memory 82 of the control device 80. In addition, it is assumed that the bank forming region A also includes a region where the bank B may be formed and the bank B is not formed.

In this case, the coating apparatus 1 first calculates a middle point E1 between the fine-alignment mark Mf1 and the fine-alignment mark Mf2 and a middle point E2 between the fine-alignment mark Mf1 and the fine-alignment mark Mf3. Subsequently, the coating apparatus 1 estimates an intersection point of a line that is parallel to a line passing the fine-alignment mark Mf1 and the fine-alignment mark Mf3 and passes the middle point E1 and a line that is parallel to a line passing the fine-alignment mark Mf1 and the fine-alignment mark Mf2 and passes the middle point E2, as the center position C of the bank forming region A.

Then, the coating apparatus 1 moves and rotates the substrate P using the moving mechanism 30 and the rotating mechanism 40 such that the estimated center position C of the bank forming region A coincides with a preset reference position. As a result, the substrate P is precisely positioned.

As described above, the coating apparatus 1 according to the present exemplary embodiment performs the positioning of the substrate P such that the center position C of the bank forming region A coincides with a preset reference position. Accordingly, even if the bank B is generally formed largely due to poor precision of the exposure device, positional deviation of the bank B in relation to the coating nozzles 51 may be suppressed to small as compared to a case where the positioning of the substrate P is performed on the basis of, for example, the fine-alignment mark Mf1. In addition, unlike the case where alignment is performed using two points including, for example, the fine-alignment mark Mf1 and the fine-alignment mark Mf2, the positioning, in which expansion/retraction of the bank B in the X-axis direction and the Y-axis direction is also considered, may be performed.

In addition, although descriptions have been made on a case where the center position C of the bank forming region A is estimated by calculating the middle points E1 and E2 of the fine-alignment marks Mf1 to Mf3 by way of an example, any other methods may be used so long as the center position C of the bank forming region A may be estimated based on the fine-alignment marks Mf1 to Mf3. That is, the coating apparatus 1 may estimate the center position C of the bank forming region A based on a positional relationship between the pre-stored positions of the fine-alignment marks Mf1 to Mf3 and the center position C of the bank forming region A and the image-captured positions of the fine-alignment marks Mf1 to Mf3.

Subsequently, the coating apparatus 1 performs a coating processing (step S106). Specifically, the coating apparatus 1 coats red (R), green (G), and blue (B) coating materials to the substrate P on the stage 20 from the coating nozzles 51 of the carriage 50 while moving the stage 20 in the positive Y-axis direction using the moving mechanism 30.

At this time, the substrate P remains precisely positioned by the above-described fine-alignment. Therefore, with the coating apparatus 1 according to the present exemplary embodiment, the coating materials may be coated inside the bank B on the substrate P with high precision during the coating processing. When the coating processing is finished, the coating apparatus 1 terminates a series of processings.

As described above, the coating apparatus 1 according to the present exemplary embodiment includes the stage 20, the moving mechanism 30, the rotating mechanism 40, the coating nozzles 51, the first imaging units 61 and 62, the second imaging units 71 to 73, and the control unit 81. The substrate P is disposed on the stage 20. The moving mechanism 30 moves the stage 20 in the horizontal direction. The rotating mechanism 40 rotates the stage 20 around the vertical axis. The coating nozzles 51 are arranged side by side in the horizontal direction above the stage 20 and coats coating materials on the substrate disposed on the stage 20. The first imaging units 61 and 62 capture the images of the substrate P disposed on the stage 20. The second imaging units 71 to 73 capture the images of the substrate P disposed on the stage 20 with a narrower viewing angle and higher resolution than the first imaging units 61 and 62. The control unit 81 controls the moving mechanism 30, the rotating mechanism 40, the first imaging units 61 and 62, and the second imaging units 71 to 73. In addition, the control unit 81 performs a pre-alignment processing of capturing the images of the circular pre-alignment marks Mp1 and Mp2 formed on the substrate P using the first imaging units 61 and 62 and performing positioning of the substrate P by controlling the moving mechanism 30 and the rotating mechanism 40 based on the captured images. After the pre-alignment processing, the control unit 81 performs a fine-alignment processing of capturing the images of the circular fine-alignment marks Mf1 to Mf3 formed on the substrate P using the second imaging units 71 to 73 and performing positioning of the substrate P by controlling the moving mechanism 30 and the rotating mechanism 40 based on the captured images.

Accordingly, with the coating apparatus 1 according to the present exemplary embodiment, a coating material may be coated with high precision inside the bank B formed on the substrate P.

In addition, in the above-described exemplary embodiment, descriptions have been made on a case where the coating apparatus 1 captures the images of the two pre-alignment marks Mp1 and Mp2 individually using the two first imaging units 61 and 62 and captures the images of the three fine-alignment marks Mf1 to Mf3 individually using the three second imaging units 71 to 73 by way of an example. Without being limited to this configuration, however, the coating apparatus 1 may capture the images of the two pre-alignment marks Mp1 and Mp2 using a single first imaging unit and may capture the images of the three fine-alignment marks Mf1 to Mf3 using a single second imaging unit. In addition, the coating apparatus 1 may capture the images of two of the three fine-alignment marks Mf1 to Mf3 using one second imaging unit and may capture the images of the other fine-alignment marks using the other second imaging unit.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating apparatus comprising:
a stage on which a substrate is disposed;
a moving mechanism configured to move the stage in a horizontal direction;
a rotating mechanism configured to rotate the stage around a vertical axis;
a plurality of nozzles arranged side by side in a horizontal direction above the stage so as to coat a coating material on the substrate disposed on the stage;
one or more first imaging units configured to capture an image of the substrate disposed on the stage;
one or more second imaging units configured to capture an image of the substrate disposed on the stage with a narrower viewing angle and higher resolution than the first imaging units; and
a control unit configured to control the moving mechanism, the rotating mechanism, the first imaging units, and the second imaging units,
wherein the control unit performs:
a pre-alignment processing of capturing one or more images of one or more circular pre-alignment marks formed on the substrate using the first imaging units and performing positioning of the substrate by controlling the moving mechanism and the rotating mechanism based on the captured images; and
after the pre-alignment processing, a fine-alignment processing of capturing one or more images of one or more circular fine-alignment marks formed on the substrate using the second imaging units and performing positioning of the substrate by controlling the moving mechanism and the rotating mechanism based on the captured images, and
the control unit captures the images of the pre-alignment marks, having a greater diameter than a diameter of the fine-alignment marks, using the first imaging units.

2. The coating apparatus according to claim 1, wherein the coating apparatus includes two first imaging units configured to capture images of two pre-alignment marks formed on the substrate, respectively, and three second imaging units configured to capture images of three fine-alignment marks formed on the substrate, respectively.

3. The coating apparatus according to claim 2, wherein the fine-alignment marks include:
   a first mark formed in a vicinity of one corner portion among corner portions of the substrate having a rectangular shape;
   a second mark formed near another corner portion adjacent to the one corner portion among the corner portions of the substrate; and
   a third mark formed at a location other than a location on a line passing the first mark and the second mark, and
   in the fine-alignment processing, the control unit estimates a center position of a bank forming region on the substrate based on positions of the first mark, the second mark, and the third mark, of which the images are captured by the three second imaging units, respectively, and matches the estimated center position with a preset reference position.

4. The coating apparatus according to claim 3, wherein the control unit calculates each of a center of gravity of the pre-alignment marks, of which the images are captured by the first imaging units, and a center of gravity of the fine-alignment marks, of which the images are captured by the second imaging units, and detects the calculated centers of gravity as positions of the pre-alignment marks and the fine-alignment marks.

5. The coating apparatus according to claim 4, wherein the control unit approximates the pre-alignment marks, of which the images are captured by the first imaging units, and the fine-alignment marks, of which the images are captured by the second imaging units, to a true circle, and then, calculates the centers of gravity of the pre-alignment marks and the fine-alignment marks.

6. The coating apparatus according to claim 1, wherein the control unit calculates each of a center of gravity of the pre-alignment marks, of which the images are captured by the first imaging units, and a center of gravity of the fine-alignment marks, of which the images are captured by the second imaging units, and detects the calculated centers of gravity as positions of the pre-alignment marks and the fine-alignment marks.

7. The coating apparatus according to claim 6, wherein the control unit approximates the pre-alignment marks, of which the images are captured by the first imaging units, and the fine-alignment marks, of which the images are captured by the second imaging units, to a true circle, and then, calculates the centers of gravity of the pre-alignment marks and the fine-alignment marks.

8. The coating apparatus according to claim 2, wherein the control unit calculates each of a center of gravity of the pre-alignment marks, of which the images are captured by the first imaging units, and a center of gravity of the fine-alignment marks, of which the images are captured by the second imaging units, and detects the calculated centers of gravity as positions of the pre-alignment marks and the fine-alignment marks.

9. The coating apparatus according to claim 8, wherein the control unit approximates the pre-alignment marks, of which the images are captured by the first imaging units, and the fine-alignment marks, of which the images are captured by the second imaging units, to a true circle, and then, calculates the centers of gravity of the pre-alignment marks and the fine-alignment marks.

10. A coating method comprising:
    a disposition process of horizontally disposing a substrate on a stage configured to be movable in a horizontal direction by a moving mechanism and rotatable around a vertical axis by a rotating mechanism;
    a pre-alignment process of capturing an image of a circular pre-alignment mark formed on the substrate using a first imaging unit and performing positioning of the substrate by controlling the moving mechanism and the rotating mechanism based on the captured image;
    after the pre-alignment process, a fine-alignment process of capturing an image of a circular fine-alignment mark, having a smaller diameter than the pre-alignment mark and formed on the substrate, using a second imaging unit with a narrower viewing angle and higher resolution than the first imaging unit, and performing positioning of the substrate by controlling the moving mechanism and the rotating mechanism based on the captured images; and
    after the fine-alignment process, a coating process of coating a coating material on the substrate using a plurality of nozzles, located above the stage and arranged side by side in the horizontal direction, while moving the substrate using the moving mechanism.

11. A coating apparatus comprising:
    a stage on which a substrate is disposed;
    a moving mechanism configured to move the stage in a horizontal direction;
    a rotating mechanism configured to rotate the stage around a vertical axis;
    a plurality of nozzles arranged side by side in a horizontal direction above the stage so as to coat a coating material on the substrate disposed on the stage;
    one or more first imaging units configured to capture an image of the substrate disposed on the stage;
    one or more second imaging units configured to capture an image of the substrate disposed on the stage with a narrower viewing angle and higher resolution than the first imaging units; and
    a control unit configured to control the moving mechanism, the rotating mechanism, the first imaging units, and the second imaging units,
    wherein two of the first imaging units are configured to capture images of two pre-alignment marks formed on the substrate, respectively, and three of the second imaging units are configured to capture images of three fine-alignment marks formed on the substrate, respectively,
    the fine-alignment marks include:
    a first mark formed in a vicinity of one corner portion among corner portions of the substrate having a rectangular shape;
    a second mark formed near another corner portion adjacent to the one corner portion among the corner portions of the substrate; and
    a third mark formed at a location other than a location on a line passing the first mark and the second mark, and
    the control unit performs:
    a pre-alignment processing of capturing one or more images of one or more circular pre-alignment marks formed on the substrate using the first imaging units and performing positioning of the substrate by controlling the moving mechanism and the rotating mechanism based on the captured images; and
    after the pre-alignment processing, a fine-alignment processing of capturing one or more images of one or more circular fine-alignment marks formed on the substrate using the second imaging units and performing positioning of the substrate by controlling the moving mechanism and the rotating mechanism based on the captured images, in the fine-alignment processing, the control unit estimates a center position of a bank forming region on the substrate based on positions of the first mark, the second mark, and the third mark, of which the images are captured by the three second imaging units, respectively, and matches the estimated center position with a present reference position.

* * * * *